INVENTOR.
ROBERT J. SOCCI
BY
ATTORNEY.

INVENTOR.
ROBERT J. SOCCI
BY Joseph H. Roediger
ATTORNEY.

3,524,149

FREQUENCY MODULATED OSCILLATOR CIRCUIT UTILIZING AVALANCHE DIODE

Robert J. Socci, Yonkers, Westchester, N.Y., assignor to General Telephone & Electronics Laboratories, Incorporated, a corporation of Delaware
Filed Feb. 23, 1968, Ser. No. 707,583
Int. Cl. H03c *3/22;* H03b *7/14*
U.S. Cl. 332—16 5 Claims

ABSTRACT OF THE DISCLOSURE

An oscillator circuit which provides frequency modulation of the high frequency signal emitted by an avalanche diode is described. The circuit utilizes first and second avalanche diodes mounted in a transverse plane of a waveguide, and tuned to resonance. The first diode is heavily reverse-biased to provide avalanche oscillations. The second diode is reverse-biased to a lesser degree and operates as a variable reactance. The application of an r-f modulating signal to the second diode results in a variation of the reactance in the plane of the first diode and the frequency modulation of the signal emitted by the first diode.

BACKGROUND OF THE INVENTION

This invention relates to oscillator circuits of the type utilizing an avalanche diode as the active element.

The detection and observation of high frequency or microwave oscillations emanating from heavily reverse-biased silicon and gallium arsenide diodes has generated interest in the use of this type of active element as a replacement for conventional high frequency sources, such as klystrons and varactor multipliers. These active elements are generally referred to as avalanche diodes and the circuits utilizing these elements are typically called avalanche oscillators.

The avalanche diode offers a substantial advantage to the user when compared with the klystron since the power supply required by the diode is a relatively small battery. Generally, the klystron employs at least three regulated power supplies to serve as the filament, resonator, and reflector supplies. Also, unlike varactor multiplier chains presently used to generate high frequency signals, complex circuitry is not required for avalanche oscillators. As a result of these advantages, a rugged, relatively inexpensive microwave source can be fabricated. Currently, the avalanche oscillator is being utilized as a local oscillator and a parametric amplifier pump source.

Briefly, the avalanche diode consists of a p-n junction semiconductor element which, when heavily reverse-biased into the avalanche breakdown region, exhibits the negative resistance characteristic of oscillatory elements. Avalanche diodes are discussed in considerable detail in an article by T. Misawa entitled "Negative Resistance in p-n Junctions Under Avalanche Breakdown Conditions, Parts I and II" and appearing in the IEEE Transactions on Electrons Devices, vol. ED–13, No. 1, January 1966. Typically, the avalanche diode is fabricated from moderately doped Si or GaAs and includes either diffused or epitaxially grown p-n junction. When the appropriate reverse-bias is applied across the avalanche diode, the junction undergoes avalanche breakdown and oscillations occur in the diode at a frequency F which is determined by the following equation:

$$F \cong V/2w$$

wherein $V$ is the scattering-limited drift velocity of carriers in the semiconductor material and $w$ is the width of the drift region. The width of the drift region is a function of the doping profile of the diode and can be controlled during fabrication. Avalanche diodes have been found to oscillate in the range of 6 to 70 gHz.

In addition to its usage as a C.W. oscillator, the avalanche diode is employed in amplitude-modulated sources. This is due to the fact that the avalanche diode is a current-controlled device with the oscillations occurring upon the application of a D.C. reverse bias thereacross. The magnitude of the reverse current supplied to the diode is found to control the amplitude of the oscillations. Thus, the output of the avalanche diode can be amplitude modulated by amplitude modulating the bias current supplied thereto. In practice, pulse and video modulation of the bias current of an avalanche oscillator can be accurately reproduced with modulation indices of about 50% at modulating frequencies in excess of 10 mHz. While the avalanche diode is experiencing increasing usage in amplitude-modulated sources, this type of active element has not generally been utilized in applications wherein a frequency-modulated microwave source is desired.

SUMMARY OF THE INVENTION

The present invention is directed to a frequency-modulated microwave source wherein an avalanche diode is employed as the active element.

The microwave source comprises a first semiconductor element having first and second electrodes and containing a p-n junction therebetween. This element is characterized by the fact that when it is reverse-biased into avalanche breakdown a negative resistance appears between the electrodes. The reverse-bias condition is obtained by applying a voltage between the first and second electrodes having a polarity such that the p-n junction is rendered normally non-conductive. The negative resistance of this type of element (hereinafter referred to as an avalanche diode) enables the avalanche diode to be utilized as the active element in a source of high frequency waves.

The avalanche diode is positioned within a section of waveguide and the first electrode thereof is coupled to a first biasing means. The second electrode is coupled to a reference potential, typically the waveguide wall. In addition, a variable reactance element having first and second electrodes is positioned within the section of waveguide in the same transverse plane. The first electrode of the variable reactance is coupled to means for varying the quiescent reactance thereof and to a R-F modulating signal source. The second electrode of the variable reactance is coupled to a reference potential, for example, the waveguide wall.

In operation, the combination of the avalanche diode and the variable reactance are electrically coupled and positioned in a transverse plane of the waveguide. This combination is tuned to a condition of resonance wherein the effective impedance is real and contains essentially no reactive component. The tuning is accomplished by utilizing the means for varying the quiescent reactance and, if necessary, employing waveguide tuning means, such as a sliding end wall. When the condition of resonance is obtained at the transverse plane containing the reactance and the avalanche diode, the application of the modulating signal to the reactance is found to frequency modulate the frequency of oscillation of the avalanche diode. Since the characteristic frequency of oscillation of the avalanche diode is determined by its physical characteristics, the negative resistance exhibited by the diode does not exist over a large band of frequencies and, therefore, a stabilizing resistor is not required to counteract the effect of a negative resistance at frequencies outside the operating band. For example, the tunnel diode exhibits a negative resistance over a broad band of frequencies and, thus, requires stabilizing means to prevent the occurrence of spurious modes of oscillation.

In one embodiment of the invention, the variable reactance comprises a second avalanche diode. This diode is coupled to a second biasing means which reverse-biases it by an amount substantially less than the first diode, i.e. less than the avalanche breakdown voltage. When so biased, the second diode appears as a capacitive impedance due to the depletion-width capacitance of the p-n junction therein. The application of the modulating voltage varies this impedance and results in the frequency modulation of the output signal of the first avalanche diode. This embodiment of the invention provides an additional advantage in that the second avalanche diode can be readily reverse-biased into avalanche breakdown by the second biasing means and its output power is added to that of the first diode thereby substantially increasing the output power of the oscillator.

Further features and advantages of the invention will become more readily apparent from the following detailed description of a preferred embodiment when taken in conjunction with the accompanying drawings.

DESCRIPTION OF THE PREFERRED EMBODIMENT

Figure 1:
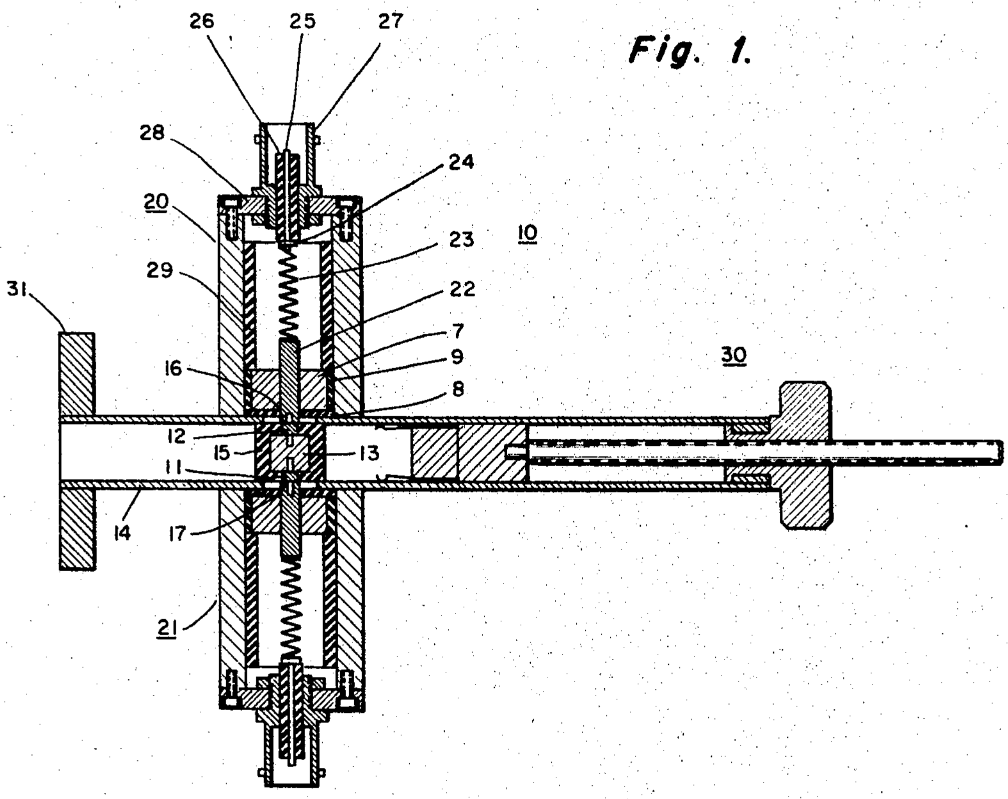
FIG. 1 is a side-view in section of one embodiment of the invention.

Referring now to FIG. 1, an avalanche oscillator 10 is shown comprising first and second avalanche diodes 11 and 12. The diodes are coupled together by conductive post 13 and positioned in a transverse plane of waveguide 14. The combination of the first and second diodes 11 and 12 and the post 13 are surrounded by insulating element 15 which provides mechanical support and prevents the diodes 11 and 12 from contacting the walls of waveguide 14.

The outwardly protruding end of each diode extends through an opening in the corresponding wall of the waveguide. At each opening, a coaxial connector is attached to the waveguide, for example by solder. The connector contains a conventional coaxial connection and in addition, provides a capacitive bypass for the microwaves propagating in the waveguide. The provision of a capacitive bypass at an opening in the wall of a waveguide insures that the opening appears as a short-circuit to the waves therein and, thus, has no significant effect on the leakage of the waveguide. The capacitive bypass of connector 20 includes insulating washer 8, conductive disc 7 having an insulating sleeve 9 interposed between its outer surface and the inner surface of connector 20, and the center conductor 22.

As shown, one end or electrode of avalanche diode 12 extends through opening 16 in the corresponding waveguide wall. Connector 20 is attached to the external surface of the waveguide and contains center conductor 22. The center conductor is biased by spring member 23 into firm contact with the corresponding end of diode 12. The opposing end of spring member 23 is attached to conductive plate 24 which is fastened to an electrically conductive tubular element 25. Element 25 is adapted to receive the center conductor of a mating external coaxial connector (not shown) and is insulated from its outer conductor 27 by insulating sleeve 26. The outer conductor 27 is designed to engage the outer conductor of the external coaxial connector.

To permit avalanche diodes to be interchanged or replaced, the outer conductor 27 is mounted on removable end plate 28 of connector 20. Also, connector 20 contains a removable insulating sleeve 29 which surrounds center conductor 22 and provides mechanical support therefor. Connector 21, which is shown mounted on the opposing wall of waveguide 14 and provides the external connection for avalanche diode 11, is smiilar in all respects to connector 20. However, it shall be noted that other types of external connections may be utilized if desired.

Waveguide 14 is provided with a flange 31 at one end which permits the oscillator to be coupled to other sections of waveguide. At the other end of the waveguide 14, tuning means 30 is provided. The tuning means, in the embodiment shown, comprises a sliding end wall of conventional construction. This end wall enables the impedance at the transverse plane of the diodes 11 and 12 to be readily adjusted.

Figure 2:
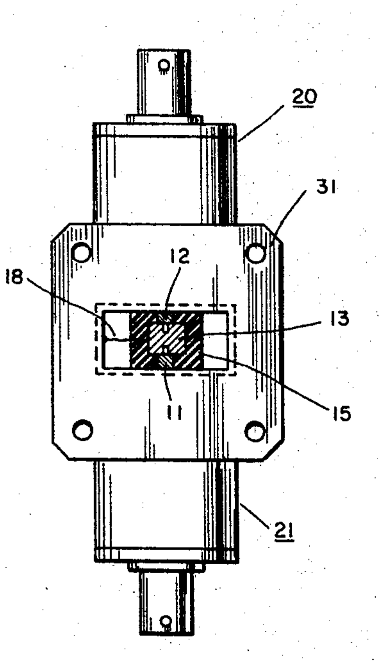
FIG. 2 is an end view of the embodiment of FIG. 1.

An end-view of the embodiment is shown in FIG. 2 wherein diodes 11 and 12 are noted to be electrically connected by conductive post 13. In addition, post 13 is coupled via wire 18 to the waveguide. In the subsequent discussion, the coupling of the post 13 to the waveguide wall is referred to as coupling the corresponding ends or electrodes of the diodes 11 and 12 to ground.

The operation of the embodiment shown is described in connection with the electrical schematic diagrams of FIGS. 3*a* and 3*b* wherein the diodes 11 and 12 are represented by their equivalent impedances and the appropriate biasing and modulation sources are electrically connected. In general, the avalanche diodes include first and second electrodes with a p-n junction therebetween. Each is mounted in a conventional diode package having the general shape as shown in FIGS. 1 and 2.

In operation, the first avalanche diode 11 is heavily reverse-biased by a first biasing means 40 into the avalanche breakdown region. The current-voltage characteristic of the avalanche diode is shown in FIG. 4*a* wherein the reverse voltage $-E_1$, typically of the order of $-35$ volts, results in the diode 11 conducting a reverse current $-I_d$. When so biased, diode 11 exhibits a negative resistance $-R$, an inductive reactance $L_s$, a depletion-width capacitance C and a mount capacitance $C_p$. The equivalent impedances of first diode 11 are shown coupled between terminals 33 and 34 of FIG. 3. Terminal 34 is coupled to ground by lead 18 while terminal 33 is coupled to one terminal of the first biasing means 40.

The second diode 12 is also reverse-biased but by a substantially lower voltage, for example $-5$ volts, and operates as a voltage-variable reactance or varactor. The capacitance-voltage characteristic of second diode 12 is shown in FIG. 4*b* wherein it is reverse-biased by a voltage $-E_2$ and exhibits a quiescent capacitance $C_o$. The diode is represented in FIG. 3*a* by the quiescent capacitance $C_o$, series resistance $R_s$, lead inductance $L_s$, and mount capacitance $C_p$ coupled between terminals 34 and 35. Terminal 35 is coupled through bias T 43 to second biasing means 41.

Figure 3A:
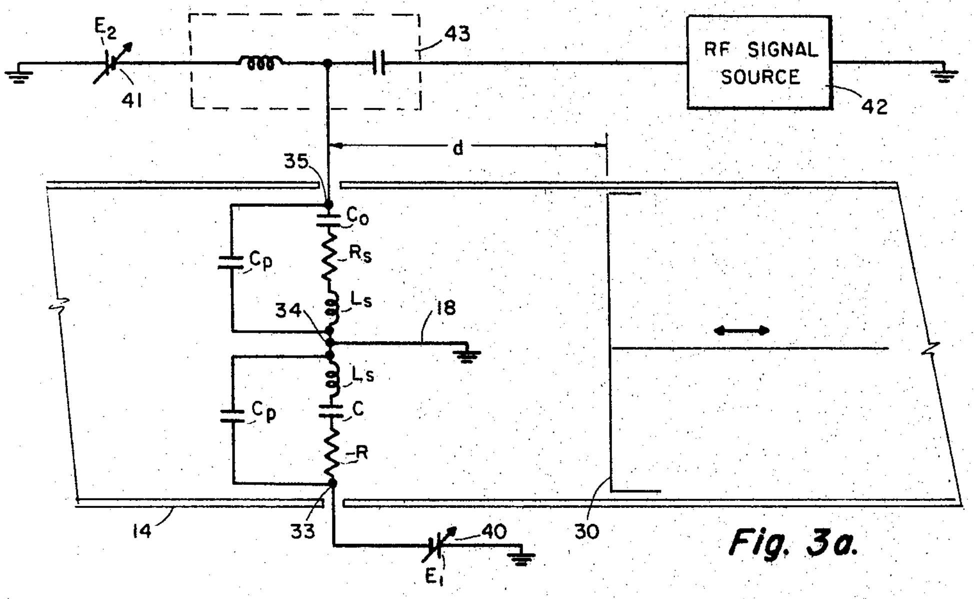
FIGS. 3*a* and 3*b* are schematic diagrams of the embodiment of FIG. 1.
Figure 3B:
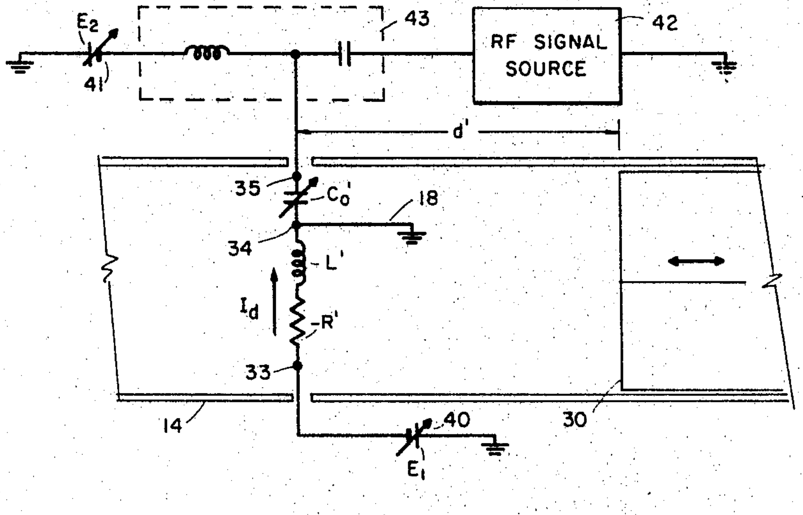
Figure 4A:
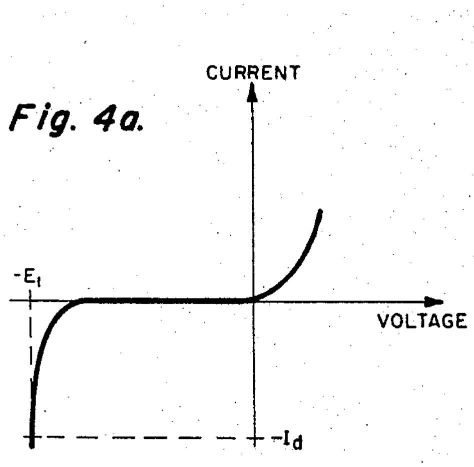
FIGS. 4*a* and 4*b* are curves showing the operating characteristics of specific components of the invention.
Figure 4B:
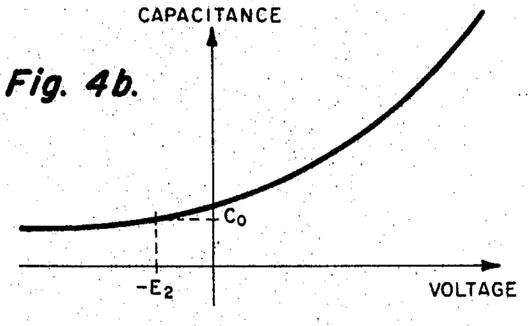

The schematic diagram of FIG. 3*a* shows the tuning means 30 of the waveguide at a distance *d* from the transverse plane containing the diodes. By varying the position of this tuning means and/or bias voltage applied to the second diode 12, a resonant condition at the frequency of oscillation of the first diode is obtained at this transverse plane. The tuning to a resonant condition refers to adjusting the impedances at the transverse plane containing the diodes so that the net reactive impedance thereat is essentially zero. This condition is shown in FIG. 3*b* wherein tuning means 30 is moved to a distance *d'* from the plane of the diodes and the impedances between terminals 33, 34 and 35 are changed. When the resonant condition is obtained, the first diode 11 emits high frequency radiation at its characteristic frequency. Although the tuning means 30 can be used to obtain the resonant condition, this condition may also be obtained by varying the reverse-bias on the second diode and changing the quiescent capacitance thereof to offset the lead inductances of both diodes.

At this time, the modulating signal from R-F signal source 42 is applied across the sceond diode 12 via bias T 43 to thereby vary the capacitance of diode 12 accordingly. The modulating of the capacitance $C_0$ of FIG. 3*b* is equivalent to varying the resonant frequency of the circuit coupled between terminals 33 and 35. As a result, it has been found that the signal generated by the first avalanche diode is modulated in accordance with the R-F modulating signal from source 42. It shall be noted that coupling terminal 34 to ground enables the two diodes to be biased by the different voltage sources and prevents the R-F modulating signal from appearing across the first diode.

In one embodiment tested and operated utilizing two Sylvania MOD avalanche diodes, the first diode had a characteristic frequency of oscillation of 10.9 gHz. and a reverse-bias curernt, $-I_d$, of 12 ma. The second diode was biased to −10 volts and an R-F modulating signal of 1 mHz. was employed.

While the above embodiment utilized first and second avalanche diodes mounted in a transverse plane of a waveguide to provide R-F modulation of the avalanche oscillation, the embodiment may also be utilized to increase the output power available at the characteristic frequency of oscillation of the first diode. This type of operation is provided by biasing both the first and second diodes in the avalanche region and then tuning the waveguide to resonance at the plane of the diodes. As a result, it has been found that the total outpower power propagating in the waveguide represents the sum of the powers available from the individual avalanche diodes.

Although the prior description has referred to a specific embodiment of the invention, it is apparent that many modifications and variations may be made therein without departing from the spirit and scope of the invention.

What is claimed is:

1. Apparatus for generating microwave signals in waveguide which comprises:

(a) a first avalanche diode having first and second electrodes, said diode being positioned within a transverse plane of said waveguide;

(b) first biasing means for applying a reverse-bias voltage between the first and second electrodes of said first diode;

(c) a second avalanche diode having first and second electrodes, said diode being positioned within said transverse plane of said waveguide, and (d) second biasing means for applying a reverse-bias voltage between the first and second electrodes of said second diode, at least one of said avalanche diodes being reverse biased into avalanche breakdown.

2. Apparatus in accordance with claim 1 further comprising means for coupling the second electrodes of said first and second diodes to said waveguide.

3. Apparatus in accordance with claim 2 further comprising tuning means positioned in said waveguide for providing a resonant condition at the transverse plane containing the first and second avalanche diodes.

4. Apparatus in accordance with claim 3 further comprising means for applying a modulating voltage between the first and second electrodes of said second diode whereby the oscillations of said first diode are frequency modulated in accordance with said modulating voltage.

5. Apparatus for generating microwave signals in a waveguide comprising:

(a) first and second avalanche diodes, each having first and second electrodes, said diodes being positioned in said waveguide in the same transverse plane, (b) first and second biasing means for applying reverse bias voltages between the first and second electrodes of said first and second avalanche diodes respectively, said first and second avalanche diodes being reverse-biased into avalanche breakdown whereby they exhibit negative resistance characteristics, (c) tuning means positioned in said waveguide for providing a resonant condition at the transverse plane containing said first and second avalanche diodes, the total power output of the microwave signals generated in said waveguide being substantially equal to the sum of the powers from the individual avalanche diodes.

References Cited

UNITED STATES PATENTS

| | | | |
|---|---|---|---|
| 3,141,141 | 7/1964 | Sharpless | 331—107 X |
| 3,400,322 | 9/1968 | Habra | 307—320 X |
| 3,426,295 | 2/1969 | De Loach et /al. | 331—107 |

OTHER REFERENCES

Fleming, "Electronic FM Modulation of GaAs Oscillators," January 1966 IBM Technical Disclosure Bulletin, vol. 8, No. 8 p. 1077 331–107G.

Amoss et al. "Frequency Modulation of Avalanche Transist Time Oscillators," IEEE Trans. on Microwave Theory and Tech., vol. MTT–15, No. 12 December 1967 pp. 742-747.

Hoefflinger, "Recent Developments on Avalanche Diode Oscillators," 331–107, The Microwave Journal, March 1969 pp. 101–115.

ALFRED L. BRODY, Primary Examiner

U.S. Cl. X.R.

307—285, 318, 320; 331—107; 332—52; 333—73, 83